United States Patent [19]

Irarrazabal et al.

[11] Patent Number: 5,309,099

[45] Date of Patent: May 3, 1994

[54] METHOD OF DETERMINING REAL-TIME SPATIALLY LOCALIZED VELOCITY DISTRIBUTION USING MAGNETIC RESONANCE MEASUREMENTS

[75] Inventors: Pablo Irarrazabal, Stanford; Bob S. Hu, Menlo Park; John Pauly, San Francisco, all of Calif.

[73] Assignee: Board of Trustees of the Leland Stanford Junior University, The, Stanford, Calif.

[21] Appl. No.: 926,982

[22] Filed: Aug. 7, 1992

[51] Int. Cl.⁵ .............................................. G01V 3/00
[52] U.S. Cl. ..................................... 324/306; 324/309
[58] Field of Search ............... 324/300, 306, 307, 309; 128/653.2, 653.3

[56] References Cited

U.S. PATENT DOCUMENTS 5,133,357  7/1992  Dumoulin et al. ................ 128/653.3

OTHER PUBLICATIONS

Demoulin et al., "Quantitative measurement of Blood Flow Using Cylindrically Localized Fourier Velocity Encoding," Magnetic Resonance in Medicine, 21:242-250 (1991) (no month).
Pearlman et al., "Real-Time MR Beam Directed Velocity Mapping: V-Mode MR Imaging," JMRI 1(2), 1991 (no month).
Walton et al., "Flow Velocity Measurements with AC Gradients," Magnetic Resonance in Medicine, 4(1), pp. 274-281 (1987) (no month).
Hu et al., "Localized Real-Time Velocity Spectra," Proceedings of 10th Meeting SMRM, Aug. 10, 1991, p. 1158.
Irarrazabal et al., "Real-Time Spatially Localized Velocity Distribution," Proceedings of Meeting SSMRM, presented in Berlin, Aug. 8, 1992.

Primary Examiner—Louis Arana
Attorney, Agent, or Firm—Townsend and Townsend Khourie and Crew

[57] ABSTRACT

Real-time spatially localized velocity distribution is measured using magnetic resonance techniques by first exciting a region of interest using an RF excitation pulse simultaneously with gradient pulses along two orthogonal axes. A cyclical read-out gradient is then applied along a read-out axis and a magnetic resonance signal is continuously sampled while the read-out gradient is applied. The excitation and read-out is repeated at time intervals to obtain time varying spatially localized velocities within the region of interest.

21 Claims, 3 Drawing Sheets

METHOD OF DETERMINING REAL-TIME SPATIALLY LOCALIZED VELOCITY DISTRIBUTION USING MAGNETIC RESONANCE MEASUREMENTS

BACKGROUND OF THE INVENTION

This invention was made with Government support under contract BCS 9058556 awarded by the National Science Foundation. The Government has certain rights in this invention.

This invention relates generally to magnetic resonance technology, and more particularly the invention relates to determining real-time spatially localized velocity distribution in a region using magnetic resonance (MR) measurements.

Magnetic resonance imaging apparatus is widely used in medical diagnosis applications. In very general terms, nuclear magnetic moments are excited at specific spin precession frequencies which are proportional to the local magnetic field. The radio-frequency signals resulting from the precession of the spins are received using pick-up coils. By manipulating the magnetic fields, an array of signals is provided representing different regions of the volume. These can be combined to produce a volumetric image of the nuclear spin density of the body.

Referring to the drawing, FIG. 1A is a perspective view partially in section illustrating coil apparatus in a MR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," *Proceedings of the IEEE*, Vol. 71, No. 3, March 1983, pp. 338–350. Briefly, the uniform static field $B_o$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR—A Perspective on Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

The strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency, $\omega_o$, of the precession of the nuclei is the product of the magnetic field $B_o$, and the so-called gyromagnetic ratio, $\gamma$, a fundamental physical constant for each nuclear species:

$$\omega_o = B_o \cdot \gamma$$

Accordingly, by superimposing a linear gradient field, $B_z = z \cdot G_z$, on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclei spin flip in response to an RF pulse excitation is proportional to the integral of the pulse over time.

Heretofore, the accurate measurement and localization of blood flow velocities has been the basis of Doppler ultrasonography which has found wide application in medical diagnosis. However, a variety of MR techniques have been employed to obtain velocity information. See, for example, Dumoulin et al., "Quantitative Measurement of Blood Flow Using Cylindrically Localized Fourier Velocity Encoding" *Magnetic Resonance in Medicine*, 21:242–250 (1991); Pearlman et al. "Real-Time MR Beam Directed Velocity Mapping: V-Mode MR Imaging" JMRI 1(2), 1991; and Walton et al. "Flow Velocity Measurements with AC Gradients" *Magnetic Resonance in Medicine* 4(1) pp. 274–281 (1987).

Flow velocities as measured using MR techniques as heretofore applied have usually been an average value of velocity in a region. However, a determination of peak velocity is often of clinical interest. The prior art techniques need voxel sizes impractically small to avoid intravoxel averaging or do not provide real time resolution.

The present invention is directed to measuring real-time flow velocity measurements which are spatially localized. A velocity distribution, as opposed to a single value, is found for every three dimensional voxel in real-time thus overcoming the necessity of small voxels.

SUMMARY OF THE INVENTION

The present invention measures real-time spatially localized velocity distribution by first exciting magnetic spins of nuclei in a region of interest using an RF pulse in the presence of two orthogonal gradient waveforms. By proper gradient selection the region of interest can be a Gaussian cylinder which is axially aligned with a blood vessel, such as the aorta, to determine time varying blood flow along the length of the vessel.

After excitation of the nuclei spins, the two orthogonal gradients are removed, and a readout gradient is applied along the readout axis. The readout gradient is a continuous time varying cyclical gradient, and the readout axis can be along the axis of the cylindrical region or oblique thereto.

The emitted signal is continuously sampled while the readout gradient is applied. This provides a trajectory in kspace covering one-half of the velocity-space area of interest. This provides sufficient data for velocity measurements. However, for ease in reconstruction twice as much data can be obtained by covering the entire velocity-space area of interest. To cover the entire area of interest, the readout gradient must be inverted and the emitted signal sampled again. The sampled signals give all velocities in all voxels in the selected region during the sampling period. By repeating the excitation and sampling at different time intervals, the real-time spatially localized velocity distribution as a function of time is obtained.

The invention and objects and features thereof will be more readily understood from the following detailed description and appended claims when taken with the drawings.

DETAILED DESCRIPTION OF ILLUSTRATIVE EMBODIMENTS

Figure 1A:
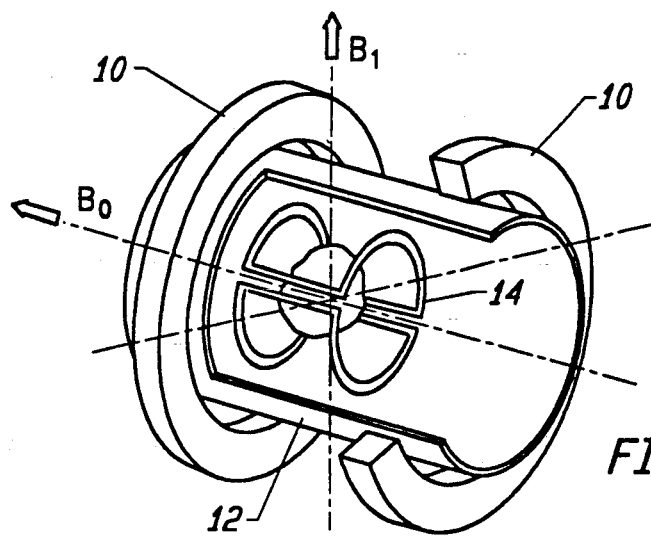
FIG. 1D illustrate the arrangement of conventional magnetic resonance apparatus and magnetic fields generated therein.
Figures 1B, 1C, 1D:
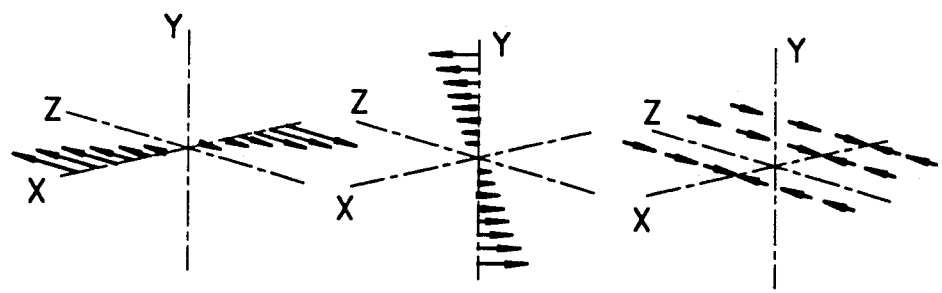
Figure 2:
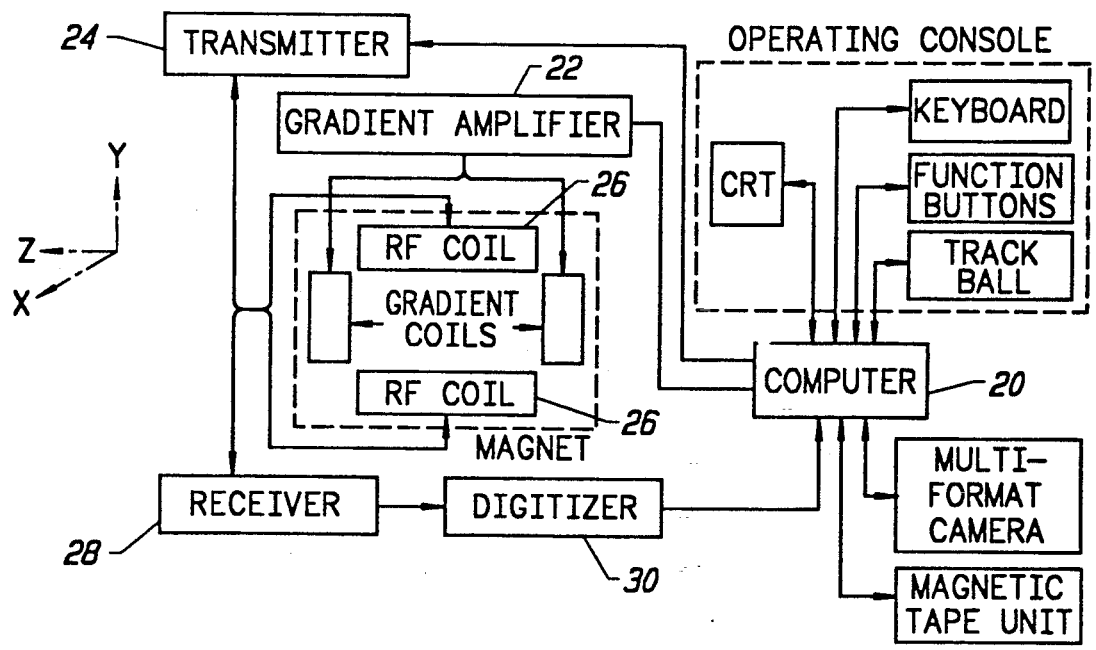
FIG. 2 is a functional block diagram of MR imaging apparatus.
Figure 3:
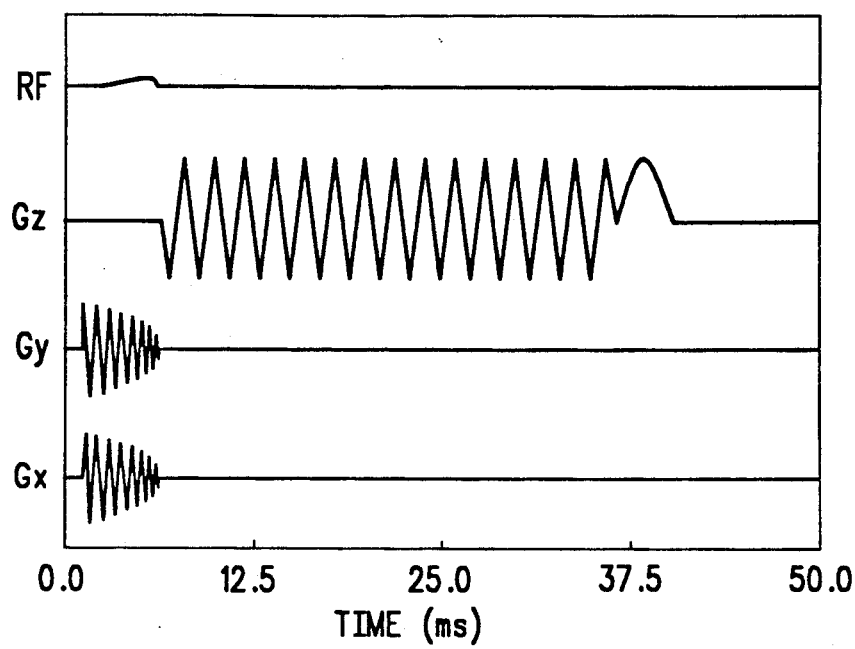
FIG. 3 illustrates a pulse sequence for real-time spatially localized velocity distribution acquisition in accordance with one embodiment of the invention.

Referring now to FIG. 3 of the drawing, a pulse sequence for the real-time spatially localized velocity distribution acquisition in accordance with one embodiment of the invention is illustrated. During the excitation period two orthogonal magnetic gradients, $G_y$ and $G_x$, are applied simultaneously with the RF excitation signal. The gradients and RF pulse provide a Gaussian cyclical excitation, as is known in the art, which can be axially aligned with a blood vessel, for example. The gradients are chosen to traverse a trajectory in k-space, and the RF pulse is the weighted two-dimensional Fourier transform of the desired excitation profile.

After application of the RF pulse, the orthogonal gradients are removed and a read out magnetic gradient, Gz, is applied. In the illustrative embodiment the read-out gradient is a continuous time varying triangular wave, but other continuous cyclical gradient waves can be employed. The cyclical gradient wave can be either repetitive or non-repetitive in waveshape. However, higher resolution is provided by increasing the area under the wave. This increases the zeroth moment and first moment of the gradient, as described below. The read-out gradient can be along the axis of the excited region or oblique thereto. Typically, the direction will be along the cylinder axis with the sequence making velocity measurements and spatially resolving along the direction of flow. It will be noted that the area of the first gradient lobe is smaller than the other lobes so that k-space can be sampled adequately for the necessary velocity and spatial resolution.

Figure 4:
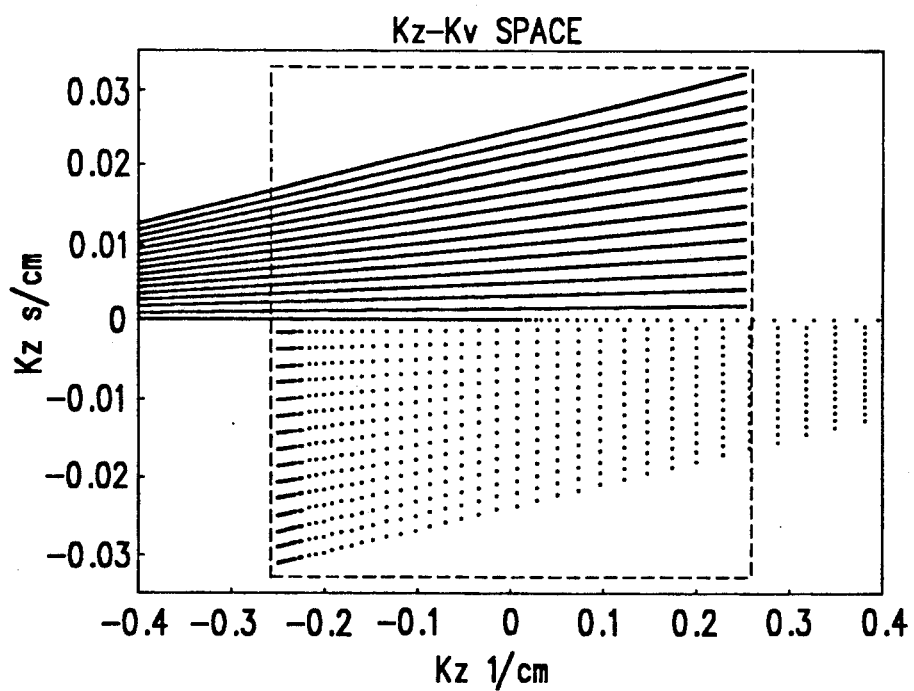
FIG. 4 illustrates the trajectory in k-space for detected signals.

FIG. 4 shows the trajectories in k-space. Since the trajectory with each excitation covers only half of k-space, two excitations are required to traverse the entire area of interest in k-space. In the second trajectory the read-out gradient is inverted. Further, since k-space sampling is not uniform, a gridding image reconstruction algorithm is employed for computation simplicity using the Fast Fourier Transform (FFT). The gridding image reconstruction algorithm is a known technique in which the grid is filled by sampling the data convolved with an interpolation kernel.

The signal received after the excitation is given by $$S(t) = \int_{\vec{z},\vec{v}} M_{xy}(\vec{z},\vec{v}) e^{-i\gamma(\vec{z}\cdot\vec{U_0}(t)+\vec{v}\cdot\vec{U_1}(t))} d\vec{z}d\vec{v}$$

where $\vec{U}_o$ and $\vec{U}_1$ are the zeroth and first moment of the gradient $\vec{G}(t)$. Higher order derivative of $\vec{r}$ or higher order moments have been neglected.

The method has been implemented on a 1.5 T GE Signa system with shielded gradients. Ernst angle excitation of duration 5 to 10 ms with 2-6 cm diameter cylinders were employed. 15 cycles of the periodic read-out gradient were used with a 30 ms total duration. The repetition time was 50 ms. Both halves of k-space were acquired by switching the sign of the gradient for excitation. The reconstruction algorithm used all pairs of consecutive excitations.

For the above values in using the voxel data in FIG. 4, the velocity resolution is 0.2 m/s with a maximum of 4.7 m/s. The spatial resolution along the axis is 2 cm. Experiments with calibrated flow rates show that the invention accurately measures velocity.

Figure 5:
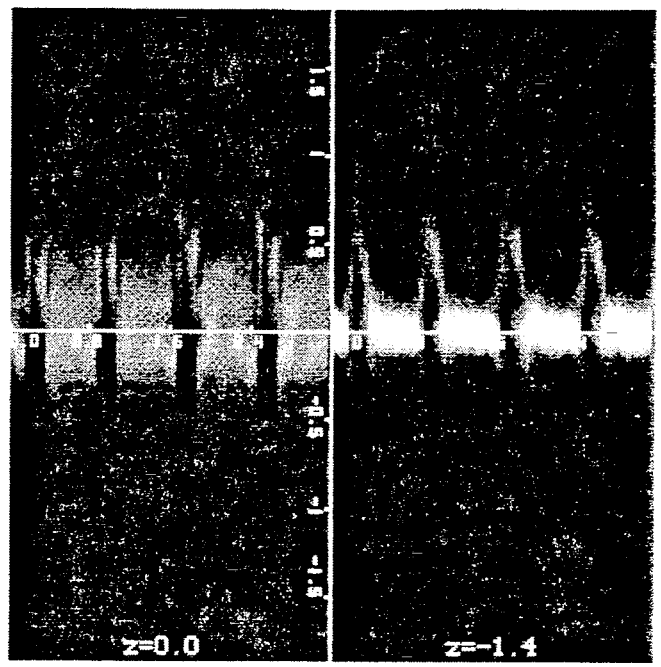
FIG. 5 illustrates velocity distribution as a function of time at two different levels of the ascending aorta.

Experiments have been conducted with human volunteers with a cylindric excitation placed on the ascending aorta. The obtained velocity amplitude, space and time behavior, as illustrated in the picture of FIG. 5, is consistent with known aortic flow. To obtain the data shown in FIG. 5, a 200 μs constant gradient at maximum amplitude was added to each peak of the oscillating gradient. This was done to get a velocity resolution of 0.08 m/s with a maximum 1.8 m/s. The spatial resolution is 1.4 cm.

The method of real-time spatially localized velocity distribution in accordance with the invention can be done in seconds on patients who are brought to an MRI laboratory for other medical diagnostic reasons. Thus, the method can be incorporated in an integral MR examination package at no extra cost.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of measuring real-time spatially localized velocity distribution in a region of a body comprising the steps of:
   (a) placing said body in a static magnetic field along a first axis (z),
   (b) applying magnetic gradient pulses along two orthogonal axes (x,y) and an RF excitation pulse to selectively excite said region,
   (c) applying a magnetic gradient along a read-out axis,
   (d) sampling a magnetic resonance signal while applying said read-out gradient, said magnetic resonance signal including velocity distribution along a spatial dimension on said read-out axis, and
   (e) obtaining a velocity distribution along said spatial dimension.

2. The method as defined by claim 1 wherein step (c) provides a k-space trajectory as a function of position and velocity.

3. The method as defined by claim 2 wherein step (e) includes a Fourier transform of said k-space trajectory.

4. The method as defined by claim 3 wherein said k-space sampling is not uniform, and step (e) includes applying a gridding image reconstruction to said k-space trajectory data.

5. The method as defined by claim 4 wherein step (b) excites a Gaussian cylinder.

6. The method as defined by claim 5 wherein step (c) applies a read-out gradient along the axis of said Gaussian cylinder.

7. The method as defined by claim 5 wherein step (c) applies a read-out gradient along an axis which is oblique to the axis of said Gaussian cylinder.

8. The method as defined by claim 1 wherein step (c) applies a cyclical magnetic gradient.

9. The method as defined by claim 1 wherein step (b) excites a Gaussian cylinder.

10. The method as defined by claim 9 wherein step (c) applies a read-out gradient along the axis of said Gaussian cylinder.

11. The method as defined by claim 9 wherein step (c) applies a read-out gradient along an axis which is oblique to the axis of the Gaussian cylinder.

12. The method as defined by claim 1 wherein steps (b), (c), and (d) are repeated with step (b) alternatively inverting said magnetic gradient.

13. The method as defined by claim 1 wherein steps (b), (c), and (d) are repeated at intervals of time to obtain the time varying spatially localized velocity measurements.

14. The method as defined by claim 13 wherein steps (b), (c), and (d) are repeated at each interval of time with step (b) alternatively inverting said magnetic gradient.

15. Apparatus for measuring real-time spatially localized velocity distribution in a region of a body comprising:
(a) means for aligning nuclei spins in said body with a static magnetic field along a first axis (z),
(b) means for applying magnetic gradient pulses along two orthogonal axes (x,y) and an RF excitation pulse to selectively excite said region,
(c) means for applying a magnetic gradient along a read-out axis,
(d) means for sampling a magnetic resonance signal while applying said read-out gradient, said magnetic resonance signal including velocity distribution along a spatial dimension on said read-out axis, and
(e) means for obtaining a velocity distribution along said spatial dimension.

16. Apparatus as defined by claim 15 wherein element (c) provides a k-space trajectory as a function of position and velocity.

17. Apparatus as defined by claim 16 wherein element (e) includes a Fourier transform of said k-space trajectory.

18. Apparatus as defined by claim 17 wherein said k-space sampling is not uniform, and element (e) applies a gridding image reconstruction to said k-space trajectory data.

19. Apparatus as defined by claim 18 wherein element (b) excites a Gaussian cylinder.

20. Apparatus as defined by claim 19 wherein element (c) applies a read-out gradient along the axis of said Gaussian cylinder.

21. Apparatus as defined by claim 15 wherein element (c) applies a cyclical magnetic gradient along said read-out axis.

* * * * *